(12) United States Patent
Hamada

(10) Patent No.: US 10,770,955 B2
(45) Date of Patent: Sep. 8, 2020

(54) CONNECTION TERMINAL ASSEMBLY AND ELECTROMOTIVE DRIVE DEVICE USING SAME

(71) Applicant: HITACHI AUTOMOTIVE SYSTEMS, LTD., Hitachinaka-shi, Ibaraki (JP)

(72) Inventor: Keiji Hamada, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 388 days.

(21) Appl. No.: 15/755,598

(22) PCT Filed: Aug. 4, 2016

(86) PCT No.: PCT/JP2016/072895
§ 371 (c)(1),
(2) Date: Feb. 27, 2018

(87) PCT Pub. No.: WO2017/149799
PCT Pub. Date: Sep. 8, 2017

(65) Prior Publication Data
US 2019/0028004 A1     Jan. 24, 2019

(30) Foreign Application Priority Data

Mar. 2, 2016   (JP) .................................. 2016-039682

(51) Int. Cl.
*H01R 13/04*       (2006.01)
*H02K 11/33*       (2016.01)
(Continued)

(52) U.S. Cl.
CPC ........... *H02K 11/33* (2016.01); *H01R 12/585* (2013.01); *H01R 13/04* (2013.01); *H02K 5/225* (2013.01);
(Continued)

(58) Field of Classification Search
CPC ... H01R 13/112; H01R 13/113; H01R 13/115; H01R 13/2457
See application file for complete search history.

(56) References Cited

U.S. PATENT DOCUMENTS 1,622,631 A  *  3/1927  Fahnestock .......... H01R 4/4809
                                                439/857
3,076,953 A  *  2/1963  Sloop .................. H01R 13/113
                                                439/857

(Continued)

FOREIGN PATENT DOCUMENTS

DE          28 13 062 A1    9/1979
JP          S61-004379 U    1/1986
(Continued)

*Primary Examiner* — Tho D Ta
(74) *Attorney, Agent, or Firm* — Foley & Lardner LLP

(57) ABSTRACT

In an electrical connection terminal assembly and an electromotive drive device, a connector-side terminal is divided into two portions along an insertion direction of the connector-side terminal, thereby constituting divided terminal pieces. These divided terminal pieces are inserted between elastic terminal pieces of a base-board-side terminal, thereby electrically connecting the two parties. In this manner, the connector-side terminal is divided into the two portions to constitute the divided terminal pieces, and thus the rigidity of each of the divided terminal pieces can be decreased. Even if the connector-side terminal has been connected to the base-board-side terminal by prying, the divided terminal pieces of the connector-side terminal deform readily to follow the shape of the base-board-side terminal and thus it is possible to suppress an increased change in an electrical resistance and/or a thermal resistance between the base-board-side terminal and the connector-side terminal.

7 Claims, 6 Drawing Sheets

(51) Int. Cl.
  *H02K 11/30* (2016.01)
  *H01R 12/58* (2011.01)
  *H02K 5/22* (2006.01)
  *H02M 7/00* (2006.01)
  *H01R 13/11* (2006.01)
  *H01R 13/24* (2006.01)
  *H01R 13/115* (2006.01)
  *H01R 13/05* (2006.01)

(52) U.S. Cl.
  CPC ............ *H02K 11/30* (2016.01); *H02M 7/003* (2013.01); *H01R 13/055* (2013.01); *H01R 13/112* (2013.01); *H01R 13/113* (2013.01); *H01R 13/115* (2013.01); *H01R 13/2457* (2013.01); *H05K 2201/10757* (2013.01)

(56) References Cited

U.S. PATENT DOCUMENTS

| | | | |
|---|---|---|---|
| 3,555,497 A * | 1/1971 | Watanabe | H01R 13/112 439/857 |
| 3,601,775 A * | 8/1971 | Longenecker | H01R 12/721 439/636 |
| 5,064,379 A * | 11/1991 | Ryll | H01R 12/58 439/81 |
| 5,415,571 A * | 5/1995 | Lutsch | H01R 13/187 439/252 |
| 6,039,584 A * | 3/2000 | Ross | H01R 25/14 439/115 |
| 6,319,075 B1 * | 11/2001 | Clark | H01R 13/11 439/65 |
| 7,556,509 B1 * | 7/2009 | Oh | H01R 13/112 439/76.2 |
| 7,581,965 B1 * | 9/2009 | Upasani | H05K 3/32 439/82 |
| 9,634,413 B2 * | 4/2017 | Hashiguchi | H01R 13/11 |
| 2007/0059993 A1 * | 3/2007 | Chen | H01R 4/4863 439/857 |
| 2015/0194857 A1 | 7/2015 | Hernandez et al. | |

FOREIGN PATENT DOCUMENTS

| | | |
|---|---|---|
| JP | 2006-066123 A | 3/2006 |
| JP | 2013-090532 A | 5/2013 |
| JP | 2014-232576 A | 12/2014 |
| JP | 2015-130346 A | 7/2015 |

* cited by examiner

CONNECTION TERMINAL ASSEMBLY AND ELECTROMOTIVE DRIVE DEVICE USING SAME

TECHNICAL FIELD

The present invention relates to an electrical connection terminal assembly and an electromotive drive device using the same and configured to be applied to an electric power steering device.

BACKGROUND ART

In the general industrial machinery fields, a mechanical-system control element is driven by an electric motor. However, in recent years, there have been proposed and developed various mechanically and electrically integrated electromotive drive devices, in which an electronic control unit that is configured to control a rotational speed and a rotational torque of an electric motor and comprised of semiconductor elements or the like, is integrally incorporated in the electric motor.

For instance in an automotive electric power steering device exemplified as a mechanically and electrically integrated electromotive drive device, both of a rotational direction and a rotational torque of a steering shaft, which is rotated by operating a steering wheel by the driver, are detected. The automotive electric power steering device is configured to drive the electric motor so as to rotate the steering shaft in the same direction as the rotational direction of the steering shaft on the basis of the detected values, thereby generating a steering assist torque.

Generally, the automotive electric power steering device uses a three-phase alternating-current brushless electric motor as an electric actuator. To drive and control the electric motor, an electronic control unit (a controller) including power-system electronic components is required. However, in recent years, to simplify the configuration, generally, the electronic control unit is not mounted separately from the electric motor, but integrated with the electric motor.

As an example of an electric motor (an electromotive drive device) for use in an electric power steering device, for instance, Japanese patent provisional publication No. JP2013-090532 A (Patent document 1) discloses an electronic control unit having a control circuit board equipped with control-system electronic components that include a microprocessor, and a power-conversion circuit board equipped with power-system electronic components that constitute an inverter. The control circuit board and the power-conversion circuit board are arranged one above the other inside of the housing provided at one end of the electric motor. In the device of the Patent document 1, a magnetic rotation sensor, which is combined with a magnet part located at a rotation shaft end, is used as a sensor for detecting rotation of the electric motor. The rotation sensor, which has a comparatively small package, is installed on a surface of the control circuit board, in more detail, on the surface of the control circuit board facing the rotation shaft end of the electric motor.

CITATION LIST

Patent Literature

Patent document 1: Japanese patent provisional publication No. JP2013-090532 A

SUMMARY OF INVENTION

Technical Problem

By the way, in the electric power steering device, electric power is supplied from a direct-current power supply such as a vehicle battery to the electric motor of the electric power steering device. Thus, a power supply connector is provided on the electronic control unit. The electronic control unit is comprised of a power-conversion circuit section equipped with a power supply circuit, and a control circuit section. The power supply circuit of the power-conversion circuit section is connected via the power supply connector to the direct-current power supply.

Generally, terminals for transmitting and receiving a comparatively large amount of power, such as base-board-side terminals, each serving as an output terminal provided on the board of the power-conversion circuit section, connector-side terminals of U-phase, V-phase and W-phase connecting connectors, each protruding from the end of the electric motor, base-board-side terminals of the power supply circuit of the power-conversion circuit section, and connector-side terminals of the power supply connector, are connected by soldering or the like. However, there is a problem such as a contact failure due to a stress concentration at the soldered section, and an increase in manufacturing costs in a soldering process.

Therefore, recently, a connection terminal assembly, in which a base-board-side terminal is formed as a press-fit type terminal and a flat-plate shaped connector-side terminal is inserted into the press-fit type terminal for connection, is used as a connection terminal assembly for transmitting and receiving a comparatively large amount of power.

The conventional connection structure of a connection terminal assembly, which uses this press-fit type terminal, is briefly explained in reference to FIGS. 7 and 8. Reference sign 70 denotes a power-conversion circuit board of a power-conversion circuit section, and two base-board-side terminals 71 (input terminals for a power supply circuit) are fixed onto the power-conversion circuit board 70. The base-board-side terminal 71 is a press-fit type terminal, in which both ends of a flat-plate shaped metal terminal material are inwardly bent to be opposed to each other and the two opposing bent portions are configured to provide elasticity (resiliency).

The connector-side terminal 72 of the power supply connector is simply inserted between the opposing bent portions of the base-board-side terminal 71, thereby ensuring easy interconnection. Hereupon, the connector-side terminal 72 is formed as a single flat-plate shape.

As can be appreciated from FIG. 8, the base-board-side terminal 71 has two opposing elastic terminal pieces 73S. The connector-side terminal 72 is inserted between the elastic terminal pieces 73S, thereby electrically connecting the two parties (the two terminals). When inserting the connector-side terminal 72, the elastic terminal pieces 73S of the base-board-side terminal 71 elastically deform, thereby permitting the connector-side terminal 72 to be elastically pinched.

By the way, the connector-side terminal 72 is often connected obliquely to the base-board-side terminal 71 by prying in a partial-contact state. In this manner, when the connector-side terminal 72 is connected to the base-board-side terminal by prying, a mutual contact area between the connector-side terminal 72 and the base-board-side terminal 71 decreases due to the partial contact, and thus an electrical resistance and/or a thermal resistance increases. Hence, there is a possibility for a problem (task) such as a decrease in reliability of the power-conversion circuit to occur.

The problem related to the prying as discussed above tends to occur during assembling. In particular, in automotive vehicles, vibrations occur during traveling. Due to the vibrations, the mutual contact area between the connector-side terminal 72 and the base-board-side terminal 71 fluctuates or varies, and thus an electrical resistance and/or a thermal resistance increases. Hence, there is a possibility for the reliability of the power-conversion circuit to decrease. Hence, there is a strong demand that an electrical resistance and/or a thermal resistance has to be stabilized. By the way, in any other base-board-side terminal that uses a press-fit type terminal other than the board of the power-conversion circuit section, there is the same demand.

In addition to the above, the previously-discussed single flat-plate shaped connector-side terminal 72 is inserted between the elastic terminal pieces 73S of the base-board-side terminal 71 with elastic deformation of these elastic terminal pieces, and thus an insert pressure of the connector-side terminal 72 must be increased because of a large surface area of the connector-side terminal 72. This leads to another manufacturing problem such as the necessity for enlargement of the assembly equipment.

It is, therefore, in view of the previously-described drawbacks of the prior art, an object of the invention to provide a new connection terminal assembly and an electromotive drive device using the same, capable of suppressing an increased change in an electrical resistance and/or a thermal resistance between a base-board-side terminal, which uses a press-fit type terminal, and a flat-plate shaped connector-side terminal.

In order to accomplish the aforementioned and other objects, the present invention is characterized in that a connector-side terminal is divided into at least two portions along an insertion direction of the connector-side terminal, thereby constituting divided terminal pieces, and that the divided terminal pieces are inserted between elastic terminal pieces of a press-fit type base-board-side terminal, thereby electrically connecting the two parties (the two terminals).

According to the invention, the connector-side terminal is divided into at least two portions to constitute the divided terminal pieces, and thus the rigidity of each of the divided terminal pieces can be decreased. Hence, even if the connector-side terminal has been connected to the base-board-side terminal by prying, the divided terminal pieces of the connector-side terminal deform readily to follow the shape of the base-board-side terminal, and thus it is possible to suppress an increased change in an electrical contact resistance and/or a thermal resistance between the base-board-side terminal and the connector-side terminal.

DESCRIPTION OF EMBODIMENTS

Embodiments of the present invention are hereinafter described in detail with reference to the accompanying drawings. It will be understood that the invention is not limited to the particular embodiments shown and described hereunder, but that various changes and modifications may be made without departing from the inventive concept of this invention.

Figure 1:
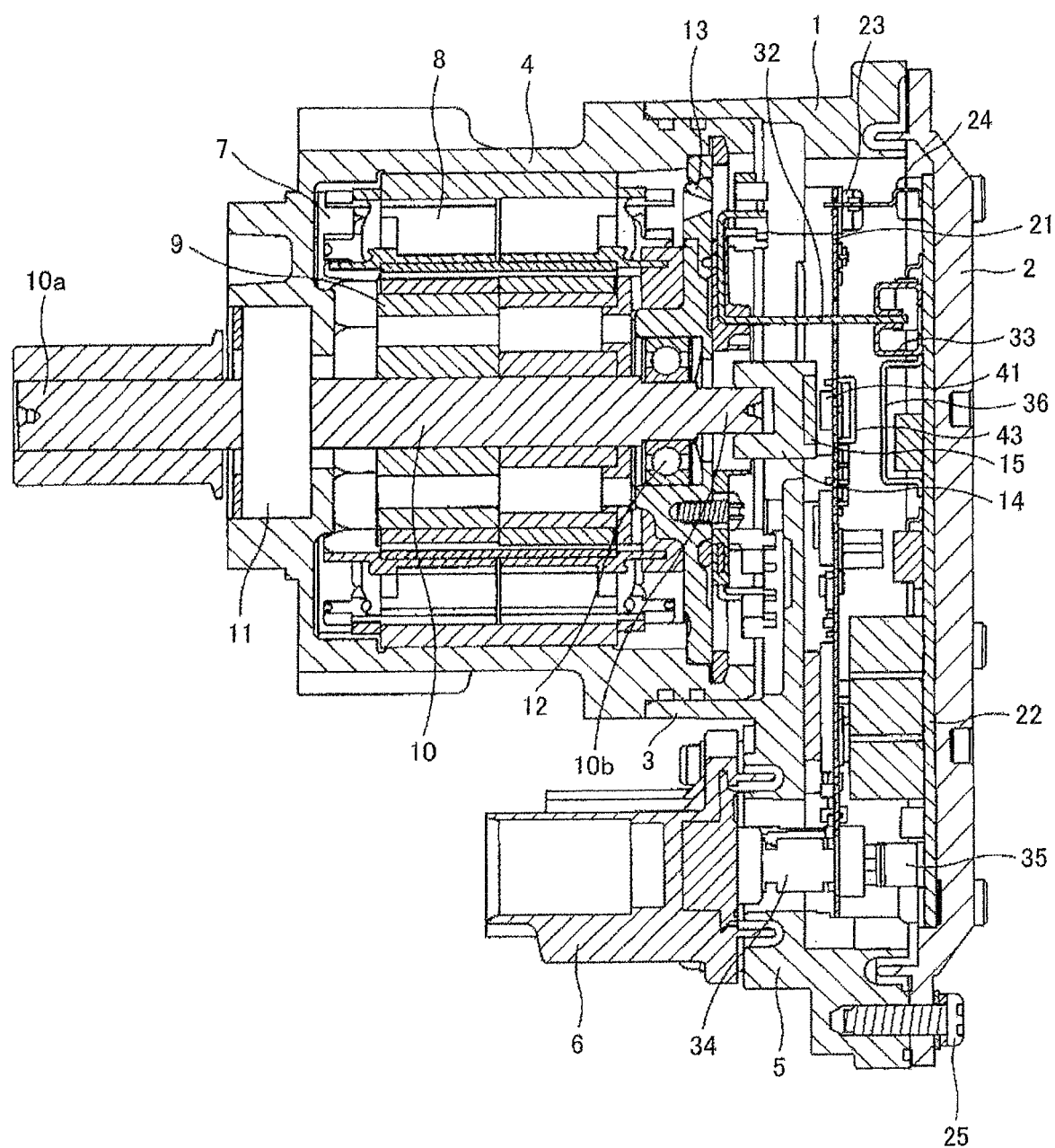
FIG. 1 is a sectional view illustrating a mechanically and electrically integrated electromotive drive device.
Figure 2:
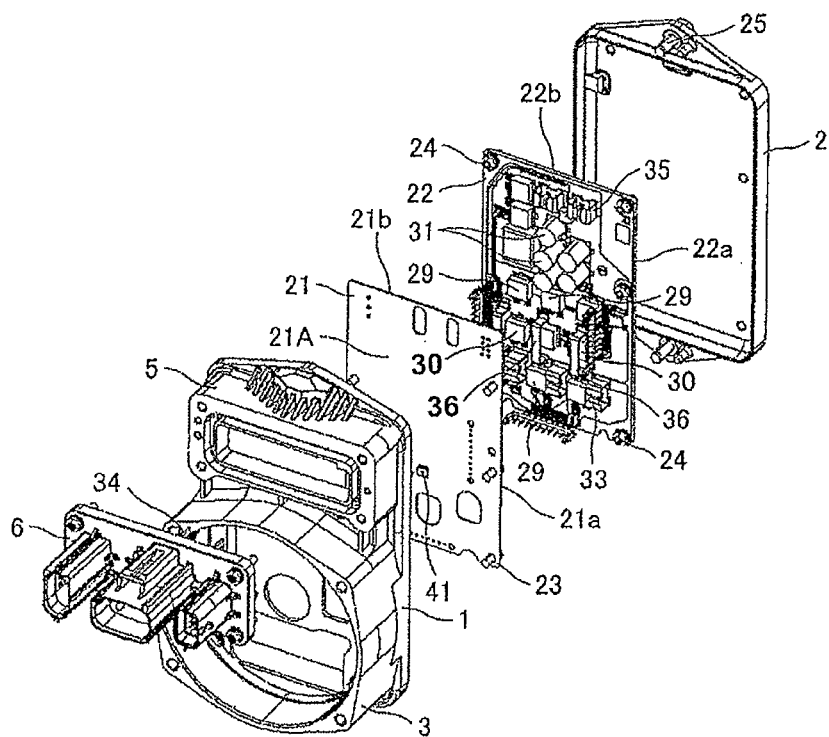
FIG. 2 is a disassembled perspective view illustrating the electromotive drive device shown in FIG. 1.

FIG. 1 is a sectional view of the electromotive drive device of the invention integrally equipped with an electronic control unit. FIG. 2 is a disassembled perspective view of the electronic control unit part. The electromotive drive device is intended to be applied to an automotive electric power steering device, for example. The electronic control unit is arranged on the opposite side to the output shaft of an electric motor.

As shown in FIG. 1, the electromotive drive device is provided with a housing 1, a cover 2, a motor housing 4, and a power supply connector 6. The housing 1 is formed by aluminum alloy die-casting and has a substantially rectangular outside shape. The cover 2 is attached to the opening of the backface of housing 1 and formed into a substantially rectangular shape by aluminum alloy die-casting. The motor housing 4 is attached to the cylindrical opening 3 of the front face of housing 1 and formed into a substantially cylindrical shape by aluminum alloy die-casting. The power supply connector 6 is attached to the rectangular opening 5 of the front face of housing 1 and made of a synthetic resin.

As shown in FIG. 1, an electric motor 7 is housed in the motor housing 4. The electric motor is configured as a three-phase alternating-current brushless motor, which is mainly comprised of a cylindrical stator 8 and a rotor 9. One end 10a of the rotation shaft 10 of rotor 9, which is supported by means of two bearings 11, 12, is structured to protrude from the top end face of motor housing 4.

The other end 10b of rotation shaft 10 is structured to protrude from the center of an end plate 13, which is configured to cover the basal-end opening of motor housing 4, into the housing 1. The other end 10b of rotation shaft 10 is provided with a magnetic part 15 that constitutes a magnetic rotation detector. In more detail, a bottomed cylindrical cap member 14 is attached to the other end 10b of rotation shaft 10. Magnet part 15, which is arranged to be concentric to the axis of the rotation shaft 10 and has a disk shape, is attached onto the end face of cap member 14. Magnet part 15 is divided into two semi-circular portions, respectively constituting an N pole semi-circular portion and an S pole semi-circular portion.

A substantially rectangular flat space is defined between the housing 1 and the cover 2, which form the electronic control unit. Two circuit boards, that is, a control circuit board 21 for a control circuit section and a power-conversion circuit board 22 for a power-conversion circuit section, are housed in this space. Each of these circuit boards, namely, the control circuit board 21 and the power-conversion circuit board 22, has almost the same rectangular outside shape configured to be substantially conformable to the shape of the internal space defined between the housing 1 and the cover 2. The control circuit board 21 and the power-conversion circuit board 22 are arranged one above the other in the internal space.

In more detail, the control circuit board 21 is fixed to the inner surface of housing 1 (the surface facing the cover 2) by means of a plurality of screws 23, while the power-conversion circuit board 22 is fixed to the inner surface of cover 2 (the surface facing the housing 1) by means of a plurality of screws 24. Therefore, the control circuit board 21 is located between the electric motor 7 and the power-conversion circuit board 22.

An appropriate clearance space is provided between the control circuit board 21 and the power-conversion circuit board 22. Basically, these two circuit boards are arranged parallel to each other. Additionally, these two circuit boards 21, 22 are arranged along a plane perpendicular to the centerline (the axis) of rotation shaft 10. By the way, the cover 2 is fixed to the housing 1 by means of a pair of screws 25.

The control circuit board 21 includes a printed wiring board using a non-metallic base material such as an epoxy-resin base material. Control-system electronic components, containing a microprocessor and the like, through which a relatively small current flows, are mounted on both sides of the control circuit board by both-sided mounting. As shown in FIG. 2, the control circuit board 21 is formed into a rectangular shape having a long side 21a and a short side 21b. Fixing holes, into which the respective screws 23 are inserted, are formed at a plurality of locations of the perimeter of the control circuit board.

The power-conversion circuit board 22 has a metal circuit board having superior heat transference and formed into a rectangular shape having a long side 22a and a short side 22b. Power-system electronic components, containing six semiconductor switching elements (MOS-FETs) 29 arranged in the form of 3×2, three phase relays 30, a plurality of electrolytic capacitors 31 and the like, through which a relatively large amount of current flows, are mounted on the power-conversion circuit board by single-sided mounting so as to constitute an inverter circuit. Also mounted on the power-conversion circuit board 22 are electronic components that constitute a power supply (a power source) such as a power supply circuit and the like.

The power-conversion circuit board 22 is further provided with base-board-side terminals 33 for pinching respective connector-side terminals (see FIG. 1) of U-phase, V-phase, and W-phase connecting connectors configured to protrude from the end of the electric motor 7 and base-board-side terminals 35 for pinching respective connector-side terminals 34 (see FIG. 2) extending from the power supply connector 6 for power supply input, together with a number of terminal pieces for connection to the control circuit board 21. Hereupon, the base-board-side terminal 33 is a press-fit type terminal.

As previously discussed, in such a press-fit type terminal, both ends of a flat-plate shaped metal terminal material are inwardly bent to be opposed to each other and the two opposing bent portions are configured to provide elasticity (resiliency). The connector-side terminal 32 of each phase is simply inserted between the opposing bent portions of the base-board-side terminal 33, thereby ensuring easy interconnection. In a similar manner, the base-board-side terminal 35, to which the connector-side terminal of the power supply connector is connected, is also configured as a press-fit type terminal.

From the necessity of transmitting and receiving a comparatively large amount of power, each of the base-board-side terminal 33 for power output for driving the electric motor 7 and the base-board-side terminal 35 for power input from a vehicle battery, these terminals being mounted on the power-conversion circuit board 22, is constructed as a press-fit type terminal.

Also provided on the power-conversion circuit board 22 are three jumpers 36 that constitute part of the wiring of the inverter circuit. Each of these three jumpers is formed by bending a comparatively thick-walled band-shaped metal conductor. Each of jumpers 36 is configured to connect a pair of semiconductor switching elements 29 associated with each phase and arranged across the phase relay 30. These three jumpers 36 are positioned side by side parallel to each other so as to be substantially conformable to arrangement of the semiconductor switching elements 29 in the form of 3×2. In more detail, these three jumpers are arranged parallel to the long side 22a of the rectangular power-conversion circuit board 22.

A rotation sensor 41, which cooperates with the above-mentioned magnet part 15 for the purpose of constituting the magnetic rotation detector, is attached onto the surface 21A of control circuit board 21. For instance, a magnetoresistance effect element (MR element) or a giant magnetoresistance effect element (GMR element) is used as the rotation sensor 41. The rotation sensor is equipped with a flat rectangular resin package, and mounted on the surface 21A of control circuit board 21 together with the other control-system electronic components. As shown in FIG. 1, the rotation sensor 41 is located on the centerline of the rotation shaft 10 of electric motor 7, in other words, at the position facing the magnet part 15. As discussed previously, magnet part 15 is divided into an N pole semi-circular portion and an S pole semi-circular portion, so as to obtain a signal, indicating a rotation angle and a rotational speed of rotor 9 (i.e., magnet part 15), from the rotation sensor 41 during rotation of the electric motor 7.

A magnetic shield 43 is attached onto the back surface of control circuit board 21, facing apart from the rotation sensor 41. The magnetic shield is formed by bending a comparatively thin-walled metal plate made of a material having a high permeability. The magnetic shield 43 has a size that can cover at least a projection area of the package of rotation sensor 41.

The configuration and operation of the electronic control unit of the electric motor as discussed above are well-known, and thus further explanation will be omitted.

As discussed previously, the connector-side terminals 32, 34 are often connected obliquely to the respective base-board-side terminals 33, 35 by prying in a partial-contact state. In this manner, when the connector-side terminals 32, 34 are connected to the respective base-board-side terminals by prying in a partial-contact state, mutual contact areas between the connector-side terminals 32, 34 and their associated base-board-side terminals 33, 35 tend to decrease, and thus an electrical resistance and/or a thermal resistance also tends to increase. Hence, there is a possibility for a problem such as a decrease in reliability of the power-conversion circuit to occur.

In particular, in automotive vehicles, vibrations occur during traveling. Due to the vibrations, the mutual contact areas between the connector-side terminals 32, 34 and the base-board-side terminals 33, 35 fluctuate, and thus an electrical resistance and/or a thermal resistance increases. Hence, there is a possibility for the reliability of the power-conversion circuit to decrease. As a matter of course, in the case that a press-fit type base-board-side terminal is used for an electronic circuit board other than the power-conversion circuit, there is an increased tendency for the same problem to occur.

In addition to the above, the flat-plate shaped connector-side terminals 32, 34 are inserted into the respective base-board-side terminals 33, 35 with elastic deformation of each of these base-board-side terminals. Thus, on the assumption that the surface area of each of connector-side terminals 32, 34 is large, an insert pressure of each of connector-side terminals 32, 34 must be increased. In this case, another manufacturing problem such as the necessity for enlargement of the assembly equipment takes place.

Because of that reason, in the shown embodiment, there is proposed a new connection terminal assembly capable of suppressing an increased change in an electrical resistance and/or a thermal resistance between the base-board-side terminal, which uses a press-fit type terminal, and the flat-plate shaped connector-side terminal.

For this purpose, in the shown embodiment, a connector-side terminal is divided into at least two portions along an insertion direction of the connector-side terminal, thereby constituting divided terminal pieces, and the divided terminal pieces are inserted into a press-fit type base-board-side terminal, thereby electrically connecting the two parties (the two terminals).

According to this, the connector-side terminal is divided into at least two portions to constitute the divided terminal pieces, and thus the rigidity of each of the divided terminal pieces can be decreased. Hence, even if the connector-side terminal has been connected to the base-board-side terminal by prying, the divided terminal pieces of the connector-side terminal deform readily to follow the shape of the base-board-side terminal, and thus it is possible to suppress an increased change in an electrical resistance and/or a thermal resistance between the base-board-side terminal and the connector-side terminal.

The configuration of the embodiment, and its operation and effects are hereinafter described in detail in reference to FIGS. 3 to 6. By the way, in the embodiment as discussed below, only the connection structure between the power supply connector and the power supply circuit provided on the power-conversion circuit board is explained, but the connection structure between the connecting connector of each phase and the power-conversion circuit board is the same.

For the sake of simplicity in the following discussion of the embodiment, FIG. 3 merely shows the power supply connector 6, the power-conversion circuit board 22, and the cover 2, while omitting the housing 1 and the motor housing 4.

Figure 3:
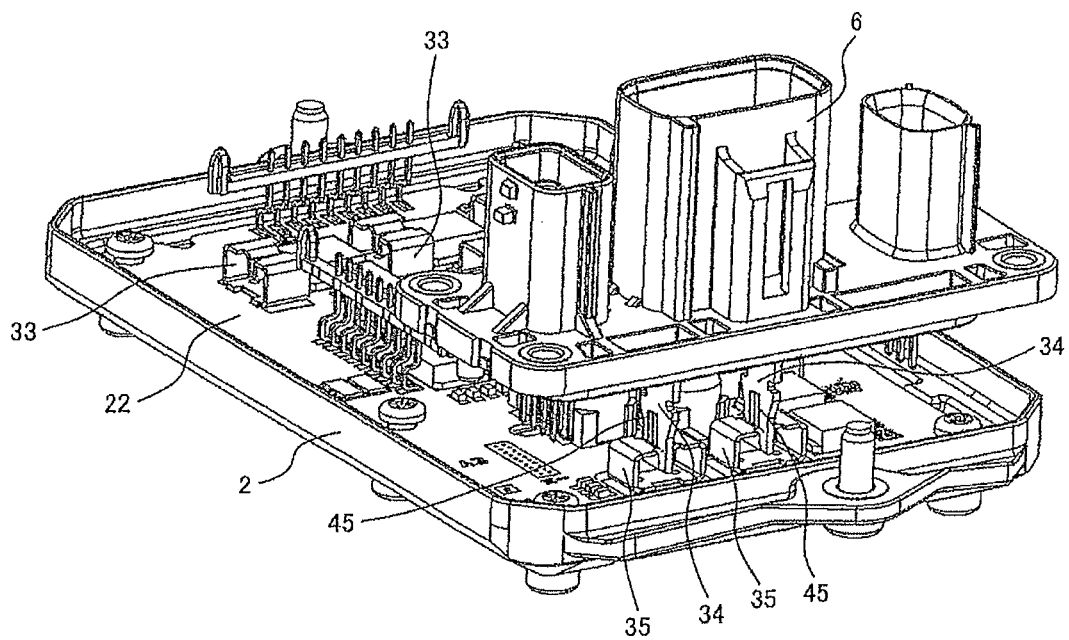
FIG. 3 is a perspective view illustrating an electronic control part of the electromotive drive device of one embodiment according to the present invention.

In FIG. 3, the power-conversion circuit board 22 is fixed to the cover 2 by means of screws.

The press-fit type base-board-side terminals 33, 35 are soldered and fixed on the power-conversion circuit board 22 by a "reflow process". The "reflow process" is a soldering process, in which a solder paste, called cream solder, is pre-applied on a wiring board in accordance with a wiring pattern, the base-board-side terminals 33, 35 are mounted on the specific section coated with the solder paste, and then heat is added directly to the wiring board, thereby melting the solder.

As previously discussed, each of the base-board-side terminals 33, 35 is a press-fit type terminal in which both ends of an elongated flat-plate shaped metal terminal material are inwardly bent to be opposed to each other and the two opposing bent portions are configured to provide elasticity (resiliency) in the direction such that the bent portions are opposed to each other. The press-fit type base-board-side terminal 33 is a power-output terminal for power output to the electric motor 7, whereas the press-fit type base-board-side terminal 35 is a power-input terminal for power input from the power supply.

The power supply connector 6 is made of a synthetic resin. The connector-side terminal 34 is embedded and fixed in the power supply connector by insert molding. One end of the connector-side terminal 34 is connected to the vehicle battery by a cable (not shown). Also, the connector-side terminal 34, which is inserted into the base-board-side terminal 35, is divided into two portions by means of a cutout 45 in an insertion direction of the connector-side terminal 34 to constitute divided terminal pieces 34B. The embodiment is characterized in that the cutout 45 of the connector-side terminal 34 is provided.

Figure 4:
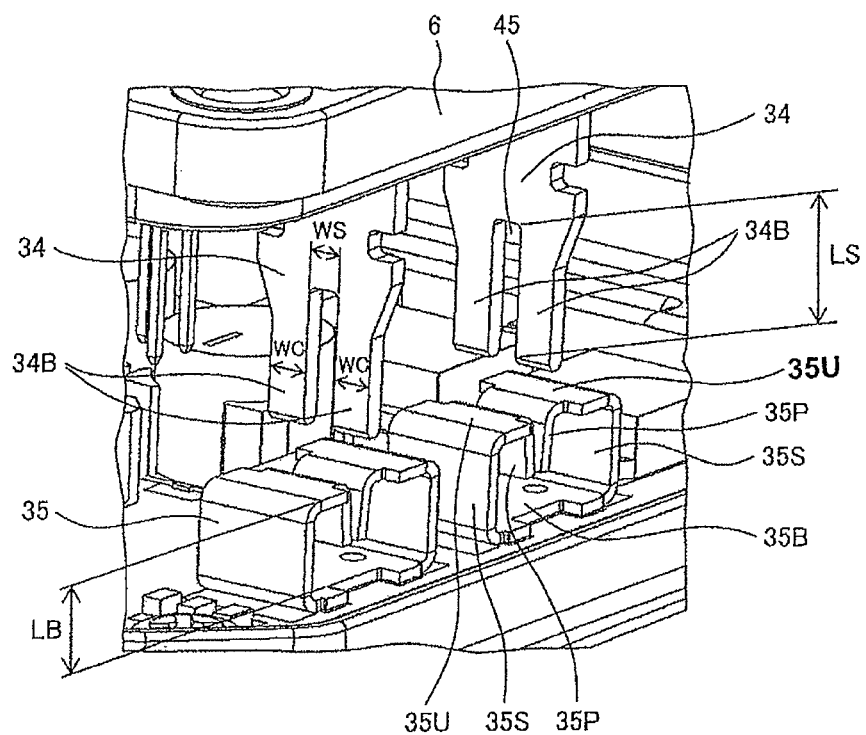
FIG. 4 is a perspective view illustrating a state before a power supply connector and a power-conversion circuit section, both shown in FIG. 3, are connected to each other.
Figure 5:
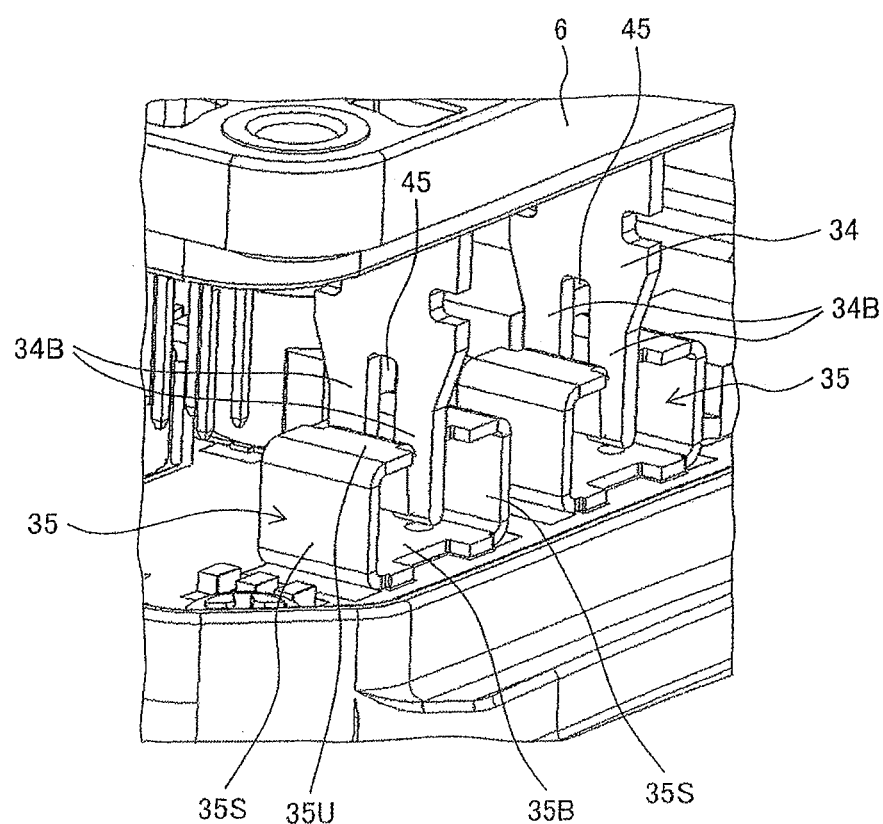
FIG. 5 is a perspective view illustrating a state after the power supply connector and the power-conversion circuit section, both shown in FIG. 4, have been connected to each other.

Next, the connector-side terminal 34 is hereunder explained in reference to FIGS. 4 and 5. FIG. 4 shows a state before the connector-side terminal 34 of the power supply connector and the base-board-side terminal 35 of the power-conversion circuit board 22 are connected to each other, while FIG. 5 shows a state after the connector-side terminal 34 of the power supply connector and the base-board-side terminal 35 of the power-conversion circuit board 22 have been connected to each other.

In FIG. 4, a bottom face portion 35B of base-board-side terminal 35 is joined to the power-conversion circuit board 22 by soldering. Side face portions 35S are configured to stand up perpendicular to the power-conversion circuit board 22 so as to extend upwards from both sides of the bottom face portion 35B. The upper ends of the side face portions 35S are bent parallel to the power-conversion circuit board 22 so as to form respective top face portions 35U. Furthermore, the top face portions 35U are obliquely bent downwards to the power-conversion circuit board 22 so as to form respective elastic terminal pieces 35P. The elastic terminal pieces 35P are resiliently (elastically) biased in the direction such that the elastic terminal pieces are opposed to each other.

On the other hand, the connector-side terminal 34 of the power supply connector 6 has an elongated flat-plate shape and has a cutout 45 formed near its center. The cutout 45 is formed along the insertion direction of the connector-side terminal 34 to penetrate the tip of the connector-side terminal 34. Hereby, the connector-side terminal 34 is completely divided into two portions from a middle part to the tip to constitute the divided terminal pieces 34B.

In this manner, the connector-side terminal 34 is divided into two portions to constitute the divided terminal pieces 34B. Thus, with regard to each individual divided terminal piece 34B its rigidity becomes comparatively smaller than the conventional single flat-shaped connector-side terminal, and hence the divided terminal piece is easily deformed. That is to say, even if the connector-side terminal 34 is connected to the base-board-side terminal 35 by prying, the divided terminal piece 34B of the connector-side terminal 34 deforms to follow to this, thereby ensuring a sufficient contact area.

In the state shown in FIG. 5, where the power supply connector 6 has been installed onto the housing 1, the divided terminal pieces 34B of the connector-side terminal 34 of the power supply connector 6 are inserted between the elastic terminal pieces 35P of the base-board-side terminal 35 of the power-conversion circuit board 22, and thus electrical connection is made. Hence, even if the connector-side terminal 34 is connected obliquely to the base-board-side terminal 35 by prying during insertion of the connector-side terminal 34, the tip of the connector-side terminal 34 is divided into two portions to constitute divided terminal pieces 34B and thus the divided terminal pieces 34B of the connector-side terminal 34 deform readily to follow in conformance to the pried state. Accordingly, it is possible to ensure a sufficient contact area.

Hitherto, when the connector-side terminal has been connected by prying, due to the partial-contact state, that is, the decrease in mutual contact area between the connector-side terminal and the base-board-side terminal, a phenomenon such as an increased change in an electrical resistance and/or a thermal resistance has occurred. In the embodiment, it is possible to suppress the occurrence of this phenomenon.

Returning to FIG. 4, from the viewpoint of the study results of the inventor, the width WS of the cutout 45 in the direction perpendicular to the insertion direction of the connector-side terminal 34 with respect to the width WC of each of the divided terminal pieces 34B located on both sides of the cutout, is dimensioned to satisfy the specific ratio relationship of WC:WS:WC=2:1:2. That is, the relationship of the width WS of the cutout 45 and the width WC of each of the divided terminal pieces 34B located on both sides of the cutout 45 has an inequality relationship of WS<WC. Hereby, it is possible to give a superior deformation following ability suitable for the pried state to the divided terminal pieces 34B of the connector-side terminal 34.

The cutout 45 has a function such that the connector-side terminal 34 is divided and thus the divided terminal pieces 34B can deform readily by virtue of the decreased rigidity of each of the divided terminal pieces, and a function such that the surface area of the connector-side terminal 34 is decreased and thus an insertion resistance (a frictional force) during insertion can be reduced.

Furthermore, the length LS of the cutout 45 formed in the connector-side terminal 34 is formed or dimensioned to be longer than the length LB between the bottom face portion 35B and the top face portion 35U of the base-board-side terminal 35. This permits the divided terminal pieces 34B to be certainly brought into contact with the elastic terminal pieces 35P, when the power supply connector 6 has been assembled on the housing 1, and thus the divided terminal pieces 34B of the connector-side terminal 34 can follow in conformance to the pried state.

In this manner, according to the embodiment, a connector-side terminal is divided into two portions along an insertion direction of the connector-side terminal by means of a cutout, thereby constituting divided terminal pieces, and that the divided terminal pieces are inserted between elastic terminal pieces of a press-fit type base-board-side terminal, thereby electrically connecting the two parties (the two terminals).

According to this, the connector-side terminal is divided into two portions to constitute the divided terminal pieces, and thus the rigidity of each of the divided terminal pieces can be decreased. Hence, even if the connector-side terminal has been connected to the base-board-side terminal by prying, the divided terminal pieces of the connector-side terminal deform readily to follow the shape of the base-board-side terminal, and thus it is possible to suppress an increased change in an electrical resistance and/or a thermal resistance between the base-board-side terminal and the connector-side terminal.

Additionally, the connector-side terminal is divided into two portions by means of a cutout, and thus the surface area of the connector-side terminal can be decreased, and thus it is possible to reduce the insert pressure of the connector-side terminal. Therefore, it is possible to solve another manufacturing problem such as the necessity for enlargement of the assembly equipment.

By the way, in the shown embodiment, the connector-side terminal 34 is divided into two portions to constitute divided terminal pieces 34B, but the connector-side terminal may be divided into three or more portions. Also, the cutout 45 is formed to extend over the width WS, but the cutout may be formed as a linear slit for constituting two divided portions.

Furthermore, the connector-side terminal 34 is divided into two portions through the cutout 45 to constitute the divided terminal pieces 34B. In lieu thereof, the connector-side terminal may be configured such that the tips of the divided terminal pieces 34B unite with each other to form a single united tip. By virtue of the united tip that the tips of the divided terminal pieces 34B unite with each other, it is possible to suppress deformation such as bending of the tip of the connector-side terminal 34 from occurring, when the connector-side terminal 34 is inserted between the elastic terminal pieces 35P of the base-board-side terminal 35.

Figure 6:
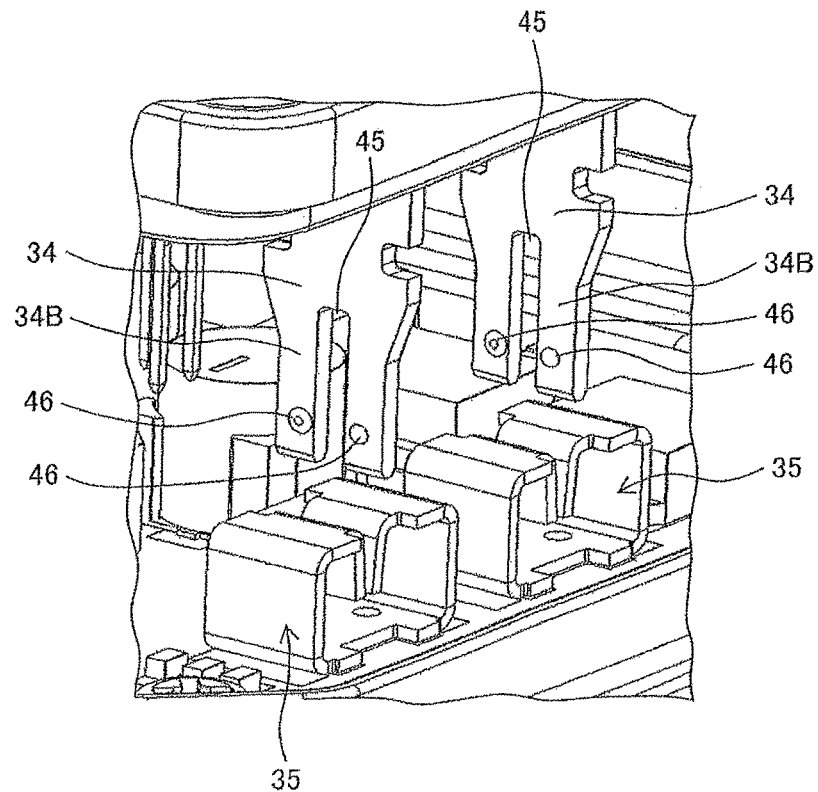
FIG. 6 is a perspective view illustrating a state before a power supply connector and a power-conversion circuit section in the other embodiment (a modification) according to the present invention are connected to each other.

Next, the modification modified from the previously-discussed embodiment is hereunder described in reference to FIG. 6. In explaining the modification, the same reference signs used to designate component parts of the embodiment shown in FIGS. 4-5 will be applied to the corresponding component parts used in the modification, while detailed description of the same reference signs will be omitted because the above description thereon seems to be self-explanatory.

In FIG. 6, at least one protrusion (indent) 46 is formed on a surface (one side or both sides) of the divided terminal piece 34B of the connector-side terminal 34. The reason for forming the protrusion 46 is as follows. By the way, the protrusions 46, which are provided on the respective divided terminal pieces 34B of the connector-side terminal 34, are formed to face opposite to each other.

Figure 7:
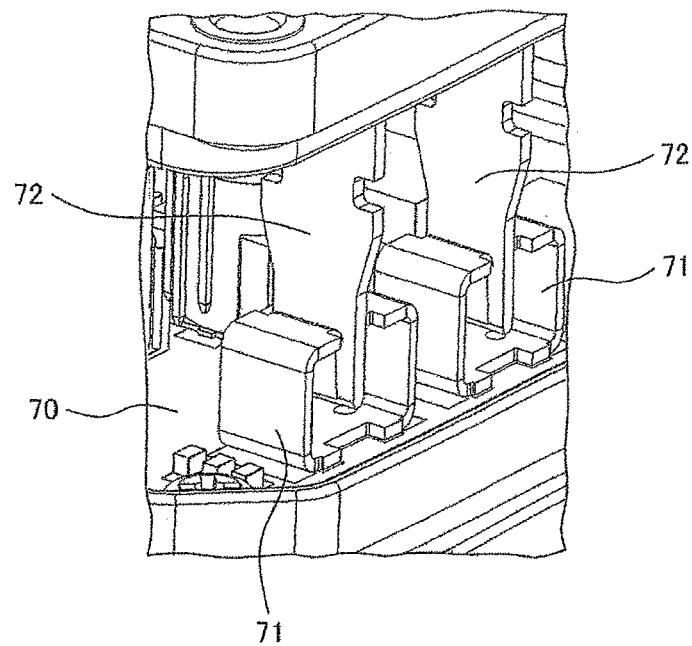
FIG. 7 is a perspective view illustrating a configuration of a conventional connection part of a power supply connector and a power-conversion circuit section.
Figure 8:
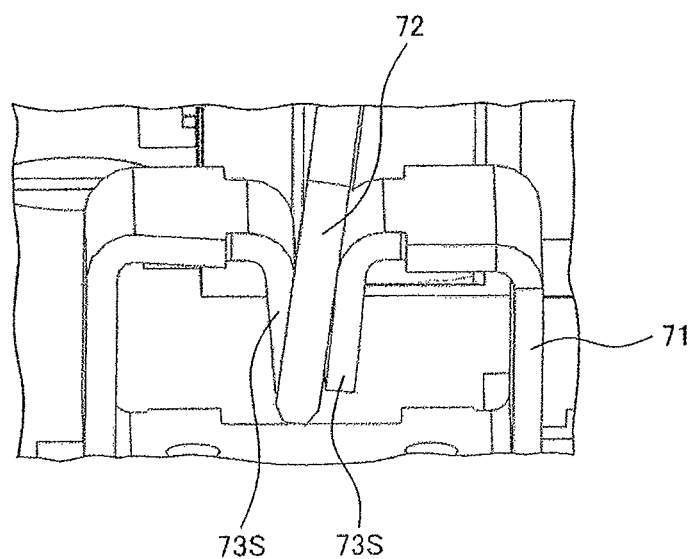
FIG. 8 is an enlarged perspective view illustrating the conventional connection part of FIG. 7.

In the embodiment shown in FIG. 4, each of the divided terminal pieces 34B of the connector-side terminal 34 has a planar shape, and thus a frictional force between the divided terminal pieces and the elastic terminal pieces 35P of the base-board-side terminal 35 in frictional-contact becomes comparatively large. As a manner of course, this frictional force is smaller than that of the conventional connector-side terminal shown in FIG. 7.

In contrast to the above, in the modification, by virtue of the formation of the protrusion 46, the contact area can be decreased, and thus a frictional force between the protrusion-equipped divided terminal pieces and the elastic terminal pieces 35P of the base-board-side terminal 35 in frictional-contact can be decreased. Hereby, it is possible to further reduce the size of the assembly equipment.

By means of the protrusion 46, the contact pressure between the divided terminal pieces 34B of the connector-side terminal 34 and the elastic terminal pieces 35P of the base-board-side terminal 35 can be increased. Hence, it is possible to ensure the contact stability over a long period of time.

As discussed above, according to the invention, a connector-side terminal is divided into at least two portions along an insertion direction of the connector-side terminal, thereby constituting divided terminal pieces, and the divided terminal pieces are inserted between elastic terminal pieces of a press-fit type base-board-side terminal, thereby electrically connecting the two parties (the two terminals).

In this manner, the connector-side terminal is divided into at least two portions to constitute the divided terminal pieces, and thus the rigidity of each of the divided terminal pieces can be decreased. Hence, even if the connector-side terminal has been connected to the base-board-side terminal by prying, the divided terminal pieces of the connector-side terminal deform readily to follow the shape of the base-board-side terminal, and thus it is possible to suppress an increased change in an electrical resistance and/or a thermal resistance between the base-board-side terminal and the connector-side terminal.

While the foregoing is a description of the preferred embodiments carried out the invention, it will be understood that the invention is not limited to the particular embodiments shown and described herein, but that various changes and modifications may be made without departing from the scope or spirit of this invention. For instance, for better understanding, the aforementioned embodiments are explained in detail, but all components/elements as explained above do not need to be provided. Furthermore, a part of components/elements of one embodiment may be replaced with a part of another embodiment. Moreover, a component/element of one embodiment may be added to components/elements of another embodiment. Also, regarding each of components/elements of each embodiment, addition, deletion, or replacement may be arbitrarily made.

As an electrical connection terminal assembly and an electromotive drive device based on the embodiments shown and explained above, several aspects described below can be taken into account.

That is to say, according to one aspect of the electrical connection terminal assembly, there is provided an electrical connection terminal assembly comprising a press-fit type base-board-side terminal disposed on a circuit board and having a pair of elastic terminal pieces in which both ends of an elongated flat-plate shaped metal terminal material are inwardly bent to be opposed to each other, and further bent to provide elasticity in a direction such that the bent portions are opposed to each other, and a connector-side terminal formed into a flat-plate shape and divided into at least two portions along an insertion direction such that the connector-side terminal is inserted between the pair of elastic terminal pieces of the press-fit type base-board-side terminal, thereby forming divided terminal pieces, the divided terminal pieces being configured to be inserted between the pair of elastic terminal pieces for power output from the press-fit type base-board-side terminal or for power input to the press-fit type base-board-side terminal.

According to one aspect of the electromotive drive device, there is provided an electromotive drive device comprising an electric motor for driving a mechanical-system control element, an electronic control unit arranged on an opposite side to an output shaft of the electric motor for controlling the electric motor, a power-conversion circuit board provided in the electronic control unit and equipped with a power-conversion circuit for driving at least the electric motor and a control circuit board provided in the electronic control unit and equipped with a control circuit for controlling the power-conversion circuit, a press-fit type base-board-side terminal disposed on the power-conversion circuit board and having a pair of elastic terminal pieces in which both ends of an elongated flat-plate shaped metal terminal material are inwardly bent to be opposed to each other, and further bent to provide elasticity in a direction such that the bent portions are opposed to each other, and a connector-side terminal formed into a flat-plate shape and divided into at least two portions along an insertion direction such that the connector-side terminal is inserted between the pair of elastic terminal pieces of the press-fit type base-board-side terminal, thereby forming divided terminal pieces, the divided terminal pieces being configured to be inserted between the pair of elastic terminal pieces for power output from the press-fit type base-board-side terminal or for power input to the press-fit type base-board-side terminal.

According to another aspect of the electromotive drive device, there is provided an electromotive drive device comprising an electric motor for driving a mechanical-system control element, an electronic control unit arranged on an opposite side to an output shaft of the electric motor for controlling the electric motor, a power-conversion circuit board provided in the electronic control unit and equipped with a power-conversion circuit for driving at least the electric motor and a control circuit board provided in the electronic control unit and equipped with a control circuit for controlling the power-conversion circuit, a power-supply connector-side terminal of a power supply connector and a power-supply base-board-side terminal connected to the power-supply connector-side terminal and disposed on the power-conversion circuit board, a power-conversion connector-side terminal of each phase of the electric motor and a power-conversion base-board-side terminal connected to the power-conversion connector-side terminal and disposed on the power-conversion circuit board, at least one of the power-supply base-board-side terminal and the power-conversion base-board-side terminal being formed as a press-fit type terminal having a pair of elastic terminal pieces in which both ends of an elongated flat-plate shaped metal terminal material are inwardly bent to be opposed to each other, and further bent to provide elasticity in a direction such that the bent portions are opposed to each other, and at least one of the power-supply connector-side terminal and the power-conversion connector-side terminal being formed as a flat-plate shaped terminal, the flat-plate shaped terminal being divided into at least two portions along an insertion direction such that the flat-plate shaped terminal is inserted between the pair of elastic terminal pieces of the press-fit type terminal, thereby forming divided terminal pieces, the divided terminal pieces being configured to be inserted between the pair of elastic terminal pieces of the press-fit type terminal.

According to a preferable aspect of the electromotive drive device, the flat-plate shaped terminal has a cutout formed near its center, the cutout being formed along the insertion direction of the flat-plate shaped terminal to penetrate a tip of the flat-plate shaped terminal, such that the flat-plate shaped terminal is completely divided into the two portions from a middle part to the tip to constitute the divided terminal pieces.

According to another preferable aspect, in any one of the preceding aspects of the electromotive drive device, a relationship of a width WS of the cutout formed in the flat-plate shaped terminal and a width WC of each of the divided terminal pieces located on both sides of the cutout has a relationship of WS<WC.

According to a further preferable aspect, in any one of the preceding aspects of the electromotive drive device, at least one protrusion is formed on one side or both sides of the divided terminal piece.

According to a still further aspect, in any one of the preceding aspects of the electromotive drive device, the protrusions, which are formed on the respective divided terminal pieces, are formed to face opposite to each other.

The invention claimed is:

1. An electrical connection terminal assembly comprising:
   a press-fit type base-board-side terminal disposed on a circuit board and having a pair of elastic terminal pieces in which both ends of an elongated flat-plate shaped metal terminal material are inwardly bent to be opposed to each other, and further bent to provide elasticity in a direction such that the bent portions are opposed to each other; and
   a connector-side terminal formed into a flat-plate shape and divided into at least two portions along an insertion direction such that the connector-side terminal is inserted between the pair of elastic terminal pieces of the press-fit type base-board-side terminal, thereby forming divided terminal pieces, the divided terminal pieces being configured to be inserted between the pair of elastic terminal pieces for power output from the press-fit type base-board-side terminal or for power input to the press-fit type base-board-side terminal.

2. An electromotive drive device comprising:
   an electric motor for driving a mechanical-system control element;
   an electronic control unit arranged on an opposite side to an output shaft of the electric motor for controlling the electric motor;
   a power-conversion circuit board provided in the electronic control unit and equipped with a power-conversion circuit for driving at least the electric motor and a control circuit board provided in the electronic control unit and equipped with a control circuit for controlling the power-conversion circuit;
   a press-fit type base-board-side terminal disposed on the power-conversion circuit board and having a pair of elastic terminal pieces in which both ends of an elongated flat-plate shaped metal terminal material are inwardly bent to be opposed to each other, and further bent to provide elasticity in a direction such that the bent portions are opposed to each other; and
   a connector-side terminal formed into a flat-plate shape and divided into at least two portions along an insertion direction such that the connector-side terminal is inserted between the pair of elastic terminal pieces of the press-fit type base-board-side terminal, thereby forming divided terminal pieces, the divided terminal pieces being configured to be inserted between the pair of elastic terminal pieces for power output from the press-fit type base-board-side terminal or for power input to the press-fit type base-board-side terminal.

3. An electromotive drive device comprising:
   an electric motor for driving a mechanical-system control element;
   an electronic control unit arranged on an opposite side to an output shaft of the electric motor for controlling the electric motor;
   a power-conversion circuit board provided in the electronic control unit and equipped with a power-conversion circuit for driving at least the electric motor and a control circuit board provided in the electronic control unit and equipped with a control circuit for controlling the power-conversion circuit;
   a power-supply connector-side terminal of a power supply connector and a power-supply base-board-side terminal connected to the power-supply connector-side terminal and disposed on the power-conversion circuit board;
   a power-conversion connector-side terminal of each phase of the electric motor and a power-conversion base-board-side terminal connected to the power-conversion connector-side terminal and disposed on the power-conversion circuit board;
   at least one of the power-supply base-board-side terminal and the power-conversion base-board-side terminal being formed as a press-fit type terminal having a pair of elastic terminal pieces in which both ends of an elongated flat-plate shaped metal terminal material are inwardly bent to be opposed to each other, and further bent to provide elasticity in a direction such that the bent portions are opposed to each other; and
   at least one of the power-supply connector-side terminal and the power-conversion connector-side terminal being formed as a flat-plate shaped terminal, the flat-plate shaped terminal being divided into at least two portions along an insertion direction such that the flat-plate shaped terminal is inserted between the pair of elastic terminal pieces of the press-fit type terminal, thereby forming divided terminal pieces, the divided terminal pieces being configured to be inserted between the pair of elastic terminal pieces of the press-fit type terminal.

4. The electromotive drive device as recited in claim 3, wherein:
   the flat-plate shaped terminal has a cutout formed near its center, the cutout being formed along the insertion direction of the flat-plate shaped terminal to penetrate a tip of the flat-plate shaped terminal, such that the flat-plate shaped terminal is completely divided into the two portions from a middle part to the tip to constitute the divided terminal pieces.

5. The electromotive drive device as recited in claim 4, wherein:
   a relationship of a width WS of the cutout formed in the flat-plate shaped terminal and a width WC of each of the divided terminal pieces located on both sides of the cutout has a relationship of WS<WC.

6. The electromotive drive device as recited in claim 5, wherein:
   at least one protrusion is formed on one side or both sides of the divided terminal piece.

7. The electromotive drive device as recited in claim 6, wherein:
   the protrusions, which are formed on the respective divided terminal pieces, are formed to face opposite to each other.

* * * * *